United States Patent [19]
Gochi et al.

[11] Patent Number: 5,583,748
[45] Date of Patent: Dec. 10, 1996

[54] SEMICONDUCTOR MODULE HAVING MULTIPLE CIRCUIT BOARDS

[75] Inventors: Hidenobu Gochi; Tetsuro Washida, both of Itami, Japan

[73] Assignee: Mitsubishi Denki Kabushiki Kaisha, Tokyo, Japan

[21] Appl. No.: 615,160

[22] Filed: Mar. 12, 1996

Related U.S. Application Data

[62] Division of Ser. No. 310,330, Sep. 22, 1994, Pat. No. 5,521,786.

[30] Foreign Application Priority Data

Sep. 30, 1993 [JP] Japan .................................. 5-244393
Dec. 24, 1993 [JP] Japan .................................. 5-328408

[51] Int. Cl.$^6$ ................................ H05K 1/11; H05K 7/00
[52] U.S. Cl. ........................ 361/784; 361/760; 361/735; 257/724
[58] Field of Search .................................. 361/735–737, 361/784–791, 760, 772, 777, 792, 796; 437/208, 915; 257/685–686, 723–724, 777; 235/380, 492

[56] References Cited

U.S. PATENT DOCUMENTS

| | | | |
|---|---|---|---|
| 5,299,094 | 3/1994 | Nishino et al. | 361/784 |
| 5,335,145 | 8/1994 | Kusui | 361/737 |

FOREIGN PATENT DOCUMENTS

| | | |
|---|---|---|
| 0417887 | 7/1990 | European Pat. Off. . |
| 2192758 | 7/1987 | United Kingdom . |

*Primary Examiner*—Bot L. Ledynh
*Attorney, Agent, or Firm*—Leydig, Voit & Mayer

[57] ABSTRACT

A semiconductor module includes a plurality of circuit boards superposed one on another, each circuit board having two opposed surfaces; and groups of electronic parts mounted on the two opposed surfaces of each of the circuit boards, the groups of electronic parts including IC packages, each IC package having a package body and leads extending outward from at least one side surface of the package body, wherein the IC packages mounted between an adjacent pair of the circuit boards in a back-to-back relationship are located on the circuit board so that the leads of one of the IC packages on one of the circuit boards are directly opposite the package body of an IC package on the other of the circuit boards.

1 Claim, 10 Drawing Sheets

23

23

23a

23a

SEMICONDUCTOR MODULE HAVING MULTIPLE CIRCUIT BOARDS

This disclosure is a division of patent application Ser. No. 08/310,330, filed Sep. 22, 1994, now U.S. Pat. No. 5,521,786.

BACKGROUND OF THE INVENTION

1. FIELD OF THE INVENTION

This invention relates to a semiconductor module having a plurality of circuit boards that are closely stacked and, more particularly, to means for preventing a short-circuit when a plurality of circuit boards each having IC packages on two opposite surfaces are superposed one on another.

2. DESCRIPTION OF THE RELATED ART

A type of semiconductor module among those constructed as IC cards or the like is arranged to improve the integration density of IC packages in the module by stacking a plurality of circuit boards. As IC packages mounted on circuits boards in such a semiconductor module, the use of lead-on-chip (LOC) type IC packages each having a structure in which inner leads extend on a chip in the package has been increased. In such LOC type IC packages, inner leads can be extended to a central portion of a semiconductor chip, for example, by using a tape-automated-bonding (TAB) tape or the like, and wire bonding is not performed. Accordingly, this type of package is advantageous in various respects in comparison with the ordinary package in which inner leads extending to the periphery of chip are connected to electrodes on the chip by wire bonding. For example, a larger chip having a large capacity or multiple functions can be packed in one package, restrictions on the disposition of electrode terminals on a semiconductor chip are reduced, and the overall thickness of the package can be reduced. Specifically, in LOC type packages, leads extend to the outside through side surfaces not at a center but at an upper or lower end of the side surfaces, since LOC type packages have a structure having an inner lead layout on a chip. The present invention relates particularly to a semiconductor module in which a plurality of circuit boards each having two surfaces on which IC packages having leads extending from upper or lower end portions of their side surfaces are mounted, the circuit boards being superposed one on another.

FIG. 11 is an exploded perspective view of a conventional IC card 100 shown as an example of this type of conventional semiconductor module. The IC card (semiconductor module) 100 has a circuit board unit 1 formed of two circuit boards 1a, 1b and a flexible connection portion 1c which connects these circuit boards. IC packages 2 and 3 are mounted on two surfaces of each of the circuit board 1a, 1b. Chip parts 4 each consisting of a chip resistor or a chip capacitor are also mounted on the two surfaces of each circuit board. A connector 6 is provided for electrical connection to an external unit (not shown) such as a terminal. The circuit board unit 1 and the connector 6 are accommodated in a frame 7. Protective metallic panels 5 are attached to obverse and reverse surfaces of the frame 7 so as to cover the circuit board unit 1 and the connector 6 on the upper and lower sides of the IC card.

The circuit board unit 1 is formed of two circuit boards 1a, 1b each having two surfaces on which IC packages 2, 3 and other parts are mounted, and connection portion 1c which electrically and mechanically connects these circuit boards. On each of the two surfaces of each circuit board 1a or 1b, Cu patterns (not shown) are formed for circuit wiring thereon. The IC packages 2, 3 and the chip parts mounted thereon are connected to each other by the Cu patterns. Electrical connections between the circuit boards 1a, 1b are made by Cu patterns (not shown) on the connection portion 1c. Electrical connections between the connector 6 and the circuit board unit 1 are made by a plurality of connector leads 6a located between the connector 6 and the circuit board 1b. The circuit board unit 1 to which the connector 6 is connected is accommodated in the frame 7 by being doubly folded at the connection portions 1c so that the circuit boards 1a and 1b are superposed and fixed in the frame 7. Thereafter, the metallic panels 5 are attached to the opposite sides of the frame 7 accommodating the circuit board unit 1 and the connector 6. The material of the panels 5 is, preferably, a metal if protection of the IC packages 2, 3 from external forces and external electrical noise is taken into consideration.

FIG. 12 is a cross-sectional view of a portion of the IC card 100 shown in FIG. 11, showing the two-layer structure of the circuit boards 1a, 1b. As shown in FIG. 12, each of the IC packages 2, 3 mounted on the circuit boards 1a, 1b is of the above-described LOC type. In each IC package 2, a chip 2a is incorporated at a center of a package body 2d, as indicated by the broken line, and inner leads 2b extend over the chip 2a from the opposite sides. Accordingly, outer leads 2c (hereinafter referred to simply as "leads") extend to the outside through upper portions of the side surfaces of the package body 2d (hereinafter referred to as "upper lead type IC package"). Each IC package 3 is substantially the same as the IC package 2 and is mounted by inverting the upper and lower sides. Leads 3c extend from lower portions of side surfaces of a package body 3d and are bent in a direction opposite to the direction in which the leads 2c of the IC package 2 are bent. (Leads 3c are hereinafter referred to as "lower lead type package".) Upper lead type IC packages 2 and lower lead type IC packages 3 are mounted on the two surfaces of each of the circuit boards 1a, 1b by being randomly positioned. Chip parts 4 are also mounted on the circuit boars 1a, 1b.

To increase the density of integration of the circuit boards, the circuit boards are stacked so that substantially no gap is formed therebetween. Accordingly, the IC packages on the lower mount surface of the circuit board 1a and the IC packages on the upper mount surface of the circuit board 1b are maintained close to or in contact with each other in a back-to-back relationship. Also, a predetermined gap is formed between each metallic panel 5 and the IC packages 2, 3 on the outermost mount surface facing the metallic panel 5.

There have also been provided semiconductor modules having other types of structures, for example, one (IC card) in which a circuit board unit having three or more circuit boards connected to each other is accommodated by being folded in a zigzag manner, and one in which a plurality of circuit boards each having IC packages mounted on its two surfaces are closely arranged on a mother board while being set upright thereon and are covered with metallic panels.

In the conventional semiconductor modules, as described above, upper lead type IC packages and lower lead type IC packages are randomly mounted on circuit boards, and it is therefore possible that, in a situation where the circuit boards are warped or the circuit boards or the entire card is deformed by an external force, and where both two IC packages mounted close to each other in a back-to-back relationship by being interposed between two circuit boards are upper lead type IC packages, leads of the IC packages, particularly shoulder portions thereof (such as those indicated at 20 in FIG. 12) will be brought into contact with each other to cause a short-circuit. In the case of IC packages with multiple pins, in particular, errors in the formation of leads are large and some lead shoulder portions may rise excessively. In such a situation, the possibility of contact between the leads is strong. Also, in the case of an upper lead type IC package mounted on a mount surface facing a metallic panel, electro-static discharge (ESD) from the metallic panel may be directly applied to shoulder portions of the leads of the IC package and cause an error in operation or breakdown of the IC package.

Further, in the case of a circuit board unit in which a plurality of circuit boards are connected as shown in FIG. 11, only one of the circuit boards is connected directly to the connector and, therefore, the pattern wiring from the connector to the other circuit boards not directly connected to the connector is excessively long and therefore has such a high line impedance that there is a possibility of failure to maintain a signal potential at a predetermined level.

The conventional semiconductor modules have the above-described drawbacks.

SUMMARY OF THE INVENTION

In view of the above-described problems, an object of the present invention is to provide a semiconductor module in which there is no possibility of occurrence of an electrical connection between leads even if a plurality of circuit boards are stacked close to or are in close contact with each other or closely arranged in a horizontal direction.

To achieve this object, according to a first aspect of the present invention, there is provided a semiconductor module comprising a plurality of circuit boards superposed one on another, and groups of electronic parts mounted on two surfaces of each of the circuit boards, the groups of electronic parts including IC packages each having leads extending outward through one of an upper end portion and a lower end portion of, at least one side surface of its package body, wherein two groups of a certain number of the IC packages are mounted between an adjacent pair of the circuit boards in positions close to or in contact with each other in a back-to-back relationship, and wherein one of each pair of the IC packages in the back-to-back relationship has leads extending outward through an upper portion of at least one side surface of the package body, while the other of the pair of the IC packages has leads extending outward through a lower portion of at least one side surface of the package body.

According to a second aspect of the present invention, there is provided a semiconductor module comprising a plurality of circuit boards superposed one on another, and groups of electronic parts mounted on two surfaces of each of the circuit boards, the groups of electronic parts including IC packages each having leads extending outward through one of an upper end portion and a lower end portion of at least one side surface of its package body, wherein two groups of a certain number of the IC packages mounted between an adjacent pair of the circuit boards in positions close to or in contact with each other in a back-to-back relationship are shifted from each other so that, with respect to two of the IC packages close to or in contact with each other, the leads of one of the two IC package face the package body of the other IC packages in contact with the package body of the former.

According to a third aspect of the invention, there is provided a semiconductor module comprising a plurality of circuit boards superposed one on another, groups of electronic parts mounted on two surfaces of each of the circuit boards, the groups of electronic parts including at least IC packages each having leads extending outward through one of an upper end portion and a lower end portion of at least one side surface of its package body, and chip parts higher in elevation than the leads of the IC packages, and metallic panels covering the electronic parts on the external sides of the semiconductor module, wherein a certain number of the IC packages and a certain number of the chip parts higher than the IC packages are mounted on mount surfaces of outermost ones of the circuit boards facing the metallic panels.

According to a fourth aspect of the invention, there is provided a semiconductor module comprising a plurality of circuit boards superposed one on another, groups of electronic parts mounted on two surfaces of each of the circuit boards, the groups of electronic parts including at least IC packages each having leads extending outward through one of an upper end portion and a lower end portion of at least one side surface of its package body, and conductive dummy component parts higher in elevation than the leads of the IC packages for conducting static electricity to ground, and metallic panels covering the electronic parts on the external sides of the semiconductor module, wherein a certain number of the IC packages and the dummy component parts for grounding static electricity are mounted on surfaces of the outermost circuit boards facing the metallic panels.

According to a fifth aspect of the invention, there is provided an IC package comprising an insulating material provided at least on an upper surface of each of its external leads.

According to a sixth aspect of the invention, there is provided a semiconductor module comprising a plurality of circuit boards superposed one on another, groups of electronic parts mounted on two surfaces of each of the circuit boards, the groups of electronic parts including at least IC packages and chip parts, and a connector having connector leads respectively connected to the circuit boards, the connector being provided for connection to an external unit.

According to a seventh aspect of the invention, there is provided a semiconductor module having components corresponding to those of the semiconductor module provided in the fifth aspect of the invention, wherein the connector has at least one internal connection leads for internal connection between the connector leads.

In the semiconductor module according to the first aspect of the present invention, the IC packages are mounted in such a manner that one of two IC packages mounted between an adjacent pair of the circuit boards contacting each other in a back-to-back relationship is an upper lead type IC package while the other is a lower lead type IC package, and a predetermined distance is maintained between the leads of the IC packages in contact with each other.

In the semiconductor module according to the second aspect of the present invention, the IC packages mounted between an adjacent pair of the circuit boards in positions such as to contact each other in a back-to-back relationship are shifted from each other so that the leads of one of two IC packages in contact with each other face the package body of the other IC package, whereby contact between the leads is prevented.

In the semiconductor module according to the third aspect of the present invention, the IC packages and the chip parts higher in elevation than the leads of the IC packages are mounted on the mount surfaces of the outermost circuit boards facing the metallic panels, the height of the leads of the IC packages mounted on each outermost mount surface is reduced relative to the height of the chip parts mounted on the same mount surface so that the distance between the metallic panel and the leads of the IC packages is larger than the distance between the metallic panel and the chip parts, thereby enabling an ESD from the metallic panel to be applied to ground.

In the semiconductor module according to the fourth aspect of the present invention, the conductive dummy component parts higher in elevation than the leads of the IC packages and used as conductors are mounted on the mount surfaces of the outermost circuit boards facing metallic panels to enable an ESD from the metallic panels to be applied to the dummy component parts.

In the IC package according to the fifth aspect of the present invention, insulating members are provided on upper surfaces of shoulder portions of the external leads of the IC packages to prevent contact between the external leads of the IC packages mounted close to or in contact with each other in a back-to-back relationship as well as to prevent application of static electricity from the metallic panels to the external leads of the IC packages mounted on the mount surfaces facing the metallic panels.

In the semiconductor module according to the sixth aspect of the present invention, electrical connections are respectively made between the plurality of circuit boards and the connector, so that the length of pattern wiring from the connector to each circuit board is limited, thereby preventing a drop of the signal level due to a high line impedance.

In the semiconductor module according to the seventh aspect of the present invention, connector leads for supplying a signal in common to different circuit boards are connected by an internal connection lead in the connector, thereby enabling the corresponding pattern wiring in an external unit to be simplified.

DESCRIPTION OF THE PREFERRED EMBODIMENTS

Preferred embodiments of the present invention will be described below with reference to the accompanying drawings.

(Embodiment 1)

Figure 1:
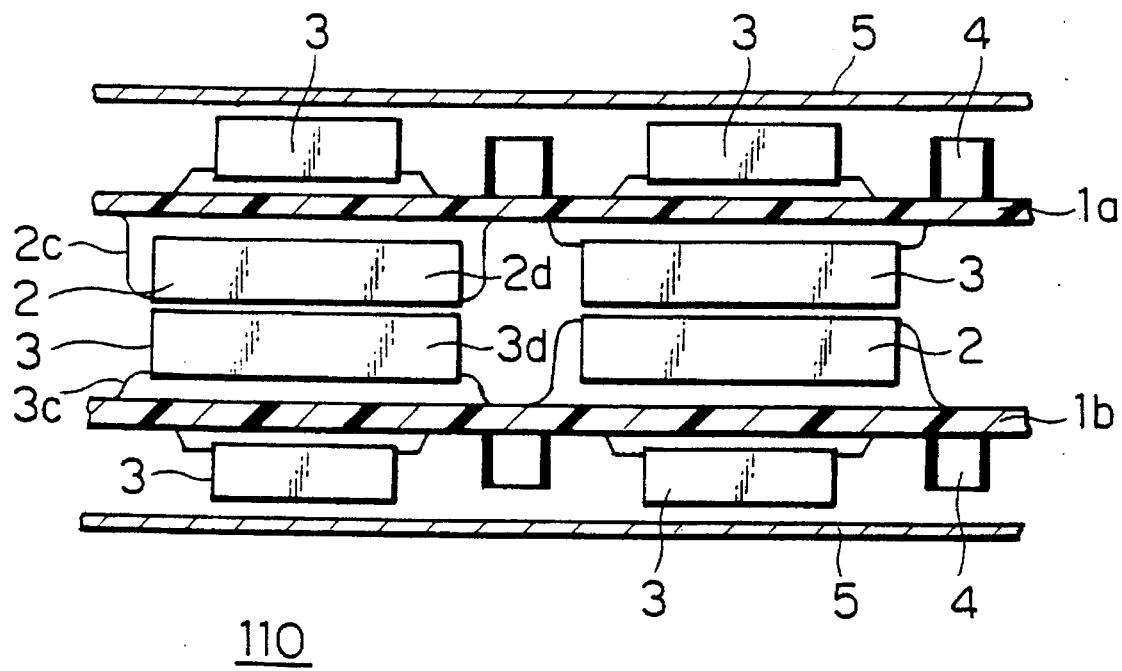
FIG. 1 is a cross-sectional view of a portion of a semiconductor module in accordance with an embodiment of the invention.
Figure 12:
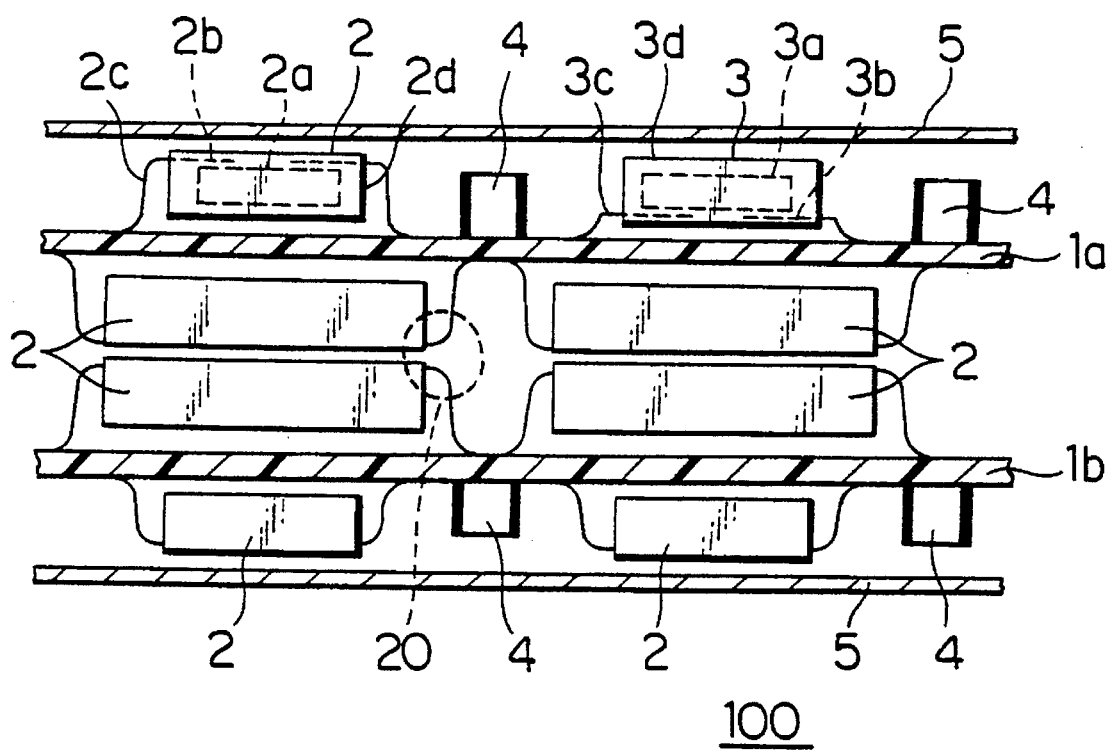
FIG. 12 is a cross-sectional view of a portion of the IC card shown in FIG. 11

FIG. 1 is a cross-sectional view of a portion of a semiconductor module (IC card) 110 in accordance with an embodiment of the present invention and corresponds to FIG. 12 of the conventional arrangement. The semiconductor module 110 includes superposed circuit boards 1a, 1b, upper lead type IC packages 2 having leads 2c and a package body 2d, lower lead type IC packages 3 having leads 3c and a package body 3d, chip parts 4 such as chip resistors and chip capacitors, and protective metallic panels 5. These components are basically the same as those of the conventional arrangement shown in FIG. 12.

A feature of the structure of this embodiment will now be described. In the semiconductor module 110 of this embodiment, in the structure in which the circuit boards 1a, 1b each having IC packages 2, 3, and chip parts 4 mounted on the two surfaces are brought close to and superposed on each other, the IC packages are mounted in such a manner that, as one pair of the IC packages disposed close to or in contact with each other in a back-to-back relationship, interposed between the two circuit boards 1a, 1b and respectively mounted on the lower surface of the circuit board 1a and the upper surface of the circuit board 1b, upper lead type IC packages 2 and lower lead type IC packages 3 are combined back to back with each other. That is, if one upper lead type IC package 2 is mounted on the lower surface of the circuit board 1a, one lower lead type IC package 3 is mounted on the upper surface of the circuit base 1b in a position opposed, in a back-to-back fashion, to the IC package 2. In this arrangement, the distance maintained between leads of the IC packages close to or in contact with each other in a back-to-back relationship is large enough to prevent the leads from contacting each other.

(Embodiment 2)

Figure 2:
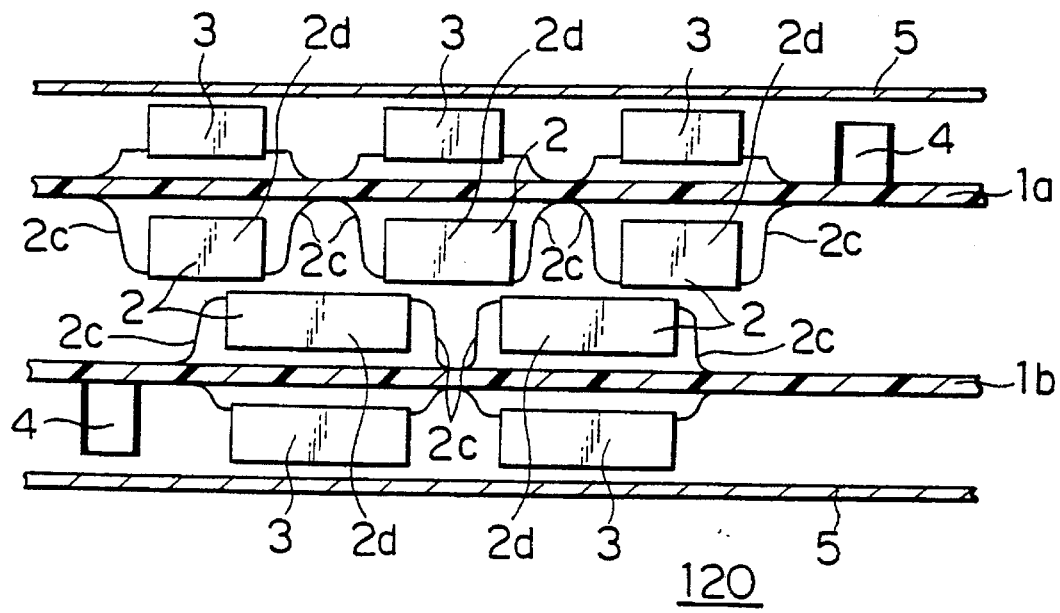
FIG. 2 is cross-sectional view of a portion of a semiconductor module in accordance with an embodiment of the invention.

FIG. 2 is a cross-sectional view of a portion of a semiconductor module (IC card) 120 in accordance with an embodiment of the present invention. The components 1 to 5 shown in FIG. 2 are identical to those indicated by the same reference characters in FIG. 1.

A feature of the structure of this embodiment will be described. In the semiconductor module 120 of this embodiment, the IC packages are mounted in such a manner that, one pair of the IC packages are disposed close to or in contact with each other in a back-to-back relationship, interposed between the two circuit boards 1a, 1b and respectively mounted on the lower surface of the circuit board 1a and the upper surface of the circuit board 1b. The IC packages 2 disposed close to each other in a back-to back relationship are shifted relative to each other in a direction parallel to the circuit boards so that the package body 2d and the leads 2c are directly opposite each other. That is, the leads 2c of one IC package 2 mounted on the upper surface of the circuit board 1b are directly opposite the package body 2d of one IC package mounted on the lower surface of the circuit board 1a, and the package body 2d of one IC package 2 mounted on the upper surface of the circuit board 1b is directly opposite the leads 2c of one IC package 2 mounted on the lower surface of the circuit board 1a. In this arrangement, leads of the IC packages can be prevented from contacting each other even if both of the IC packages disposed close to or in contact with each other in a back-to-back relationship are upper lead type IC packages 2.

(Embodiment 3)

Figure 3:
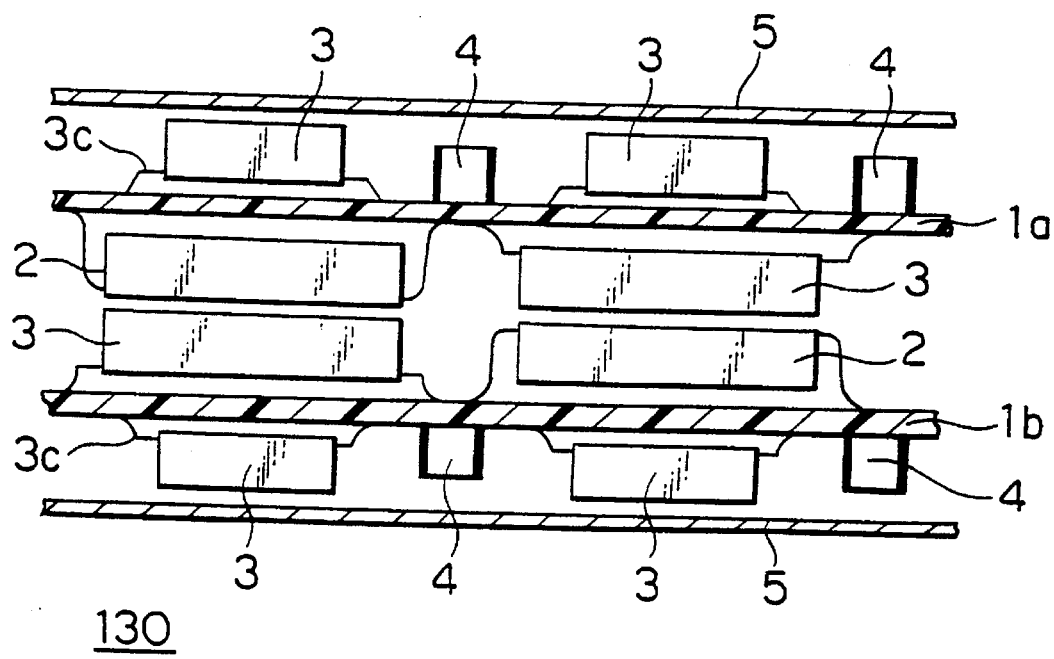
FIG. 3 is cross-sectional view of a portion of a semiconductor module in accordance with an embodiment of the invention.

FIG. 3 is a cross-sectional view of a portion of a semiconductor module (IC card) 130 in accordance with an embodiment of the present invention. The components 1 to 5 shown in FIG. 3 are identical to those indicated by the same reference characters in FIG. 1.

A feature of the structure of this embodiment will be described. In the semiconductor module 130 of this embodiment, in the structure in which the circuit boards 1a, 1b each having IC packages 2, 3, and chip parts 4 mounted on the two surfaces are superposed on each other, only lower lead type IC packages 3 and chip capacitors 4 higher in elevation than the leads of the packages 3 are mounted on the upper surface of the circuit board 1a and the lower surface of the circuit base 1b facing metallic panels 5, while upper lead type IC packages 2 having leads extending at positions higher than chip capacitors 4 are mounted on the inner mount surfaces. As a result, the distance between each metallic panel 5 and the leads 3c of the IC packages 3 is larger than the distance between the metallic panel 5 and the chip capacitors 4, so that an electrostatic discharge (ESD) from each metallic panel 5 is applied to the chip capacitors 4 but is not applied to the leads 3c of the IC packages 3. Generally, capacitor chips 4 are connected between a power source Vcc and ground GND and are not easily damaged by static electricity in contrast with IC packages. Static electricity (ESD) applied to chip capacitors 4 is applied directly to ground GND of the circuit board (escapes to the ground of a terminal or the like if the semiconductor module is connected to an external unit). It is therefore possible to prevent chips incorporated in the IC packages from being damaged by static electricity. The influence of static electricity upon the operation of the semiconductor module is very small.

In this embodiment, all the IC packages mounted on the mount surfaces facing the metallic panels 5 are lower lead type IC packages 3. However, there is no problem in mounting any other type of IC packages on these mount surfaces, as long as the leads are not higher than chip capacitors 4.

(Embodiment 4)

Figure 4:
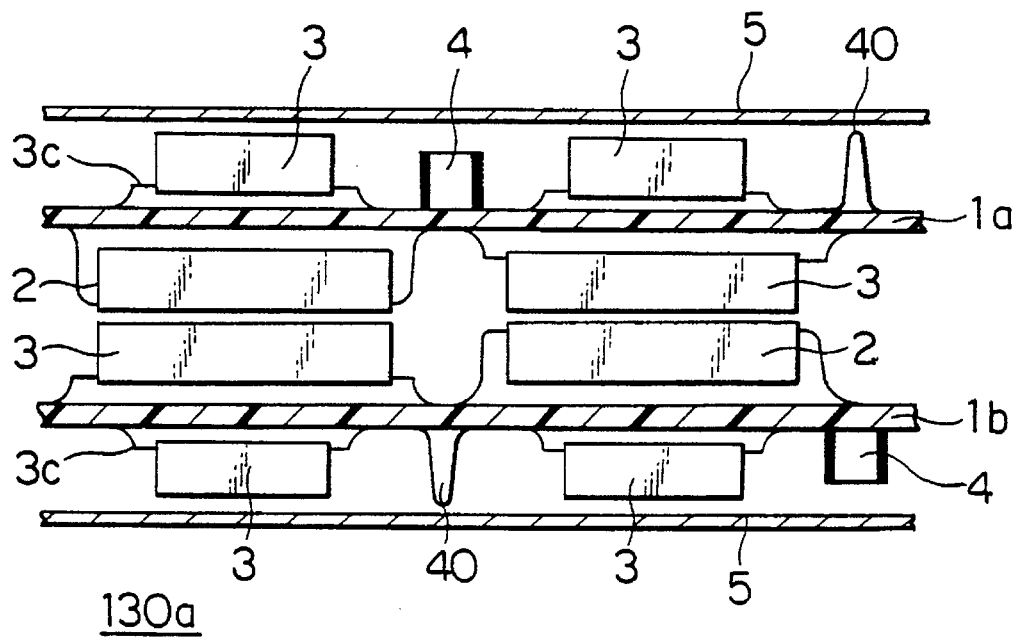
FIG. 4 is cross-sectional view of a portion of a semiconductor module in accordance with an embodiment of the invention.

FIG. 4 is a cross-sectional view of a portion of a semiconductor module (IC card) 130a in accordance with an embodiment of the present invention. The components 1 to 5 shown in FIG. 4 are identical to those, indicated by the same reference characters in FIG. 1. Dummy component parts 40 are provided which are formed of a conductive material and which serve as conductors for conducting an ESD from metallic panels 5 to ground.

Figure 5:
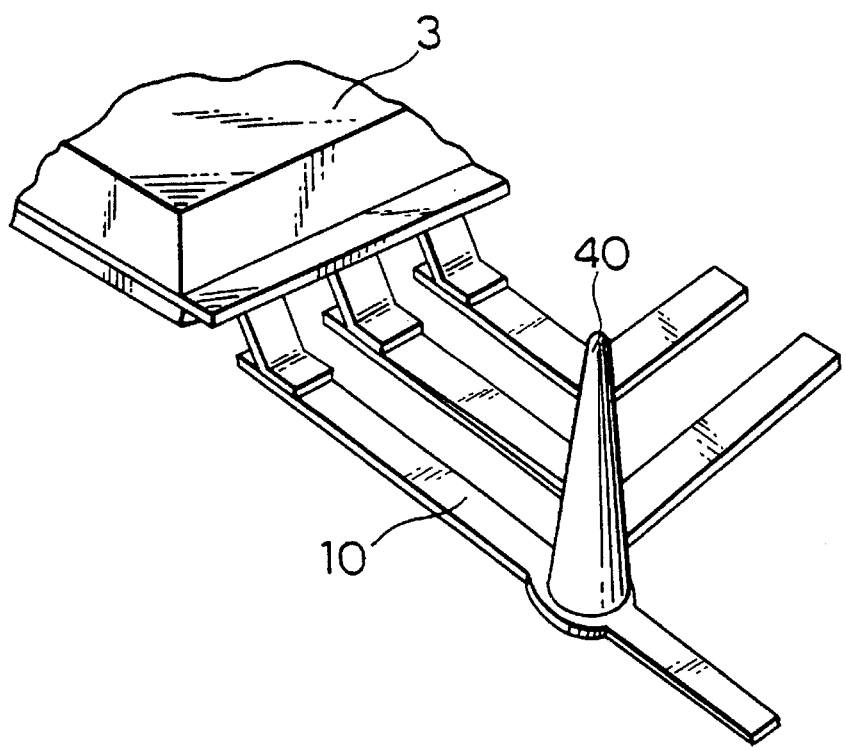
FIG. 5 is an enlarged perspective view of a dummy component part in a portion of the semiconductor module shown in FIG. 4.

A feature of the structure of this embodiment will be described. In the semiconductor module 130a of this embodiment, dummy component parts 40 higher in elevation than the leads of IC packages 3 are mounted on the upper surface of the circuit board 1a and the lower surface of the circuit board 1b facing the metallic panels 5. The dummy component parts 40 are fixed on circuit patterns 10 connected to ground GND, for example, by soldering (not shown) or the like, as shown in FIG. 5. An ESD from the metallic panels 5 is thereby directly applied to ground of the circuit boards through the dummy component parts 40, thereby preventing chips incorporated in the IC packages 3 form being damaged by static electricity applied to the IC packages 3 (particularly by static electricity applied to signal leads). The influence of static electricity upon the operation of the semiconductor module is very small.

In this embodiment, all the IC packages mounted on the mount surfaces facing the metallic panels 5 are lower lead type IC packages 3. However, there is no problem in mounting any other type of IC packages on these mount surfaces, as long as the leads are not higher than the dummy component parts 40.

(Embodiment 5)

An example of an IC package design will next be described, which is intended to prevent contact between leads of IC packages disposed close to or in contact with each other in a back-to-back relationship in semiconductor modules such as those described above as embodiments of the present invention as well as to prevent application of static electricity from the metallic panels to the leads.

Figure 6A:
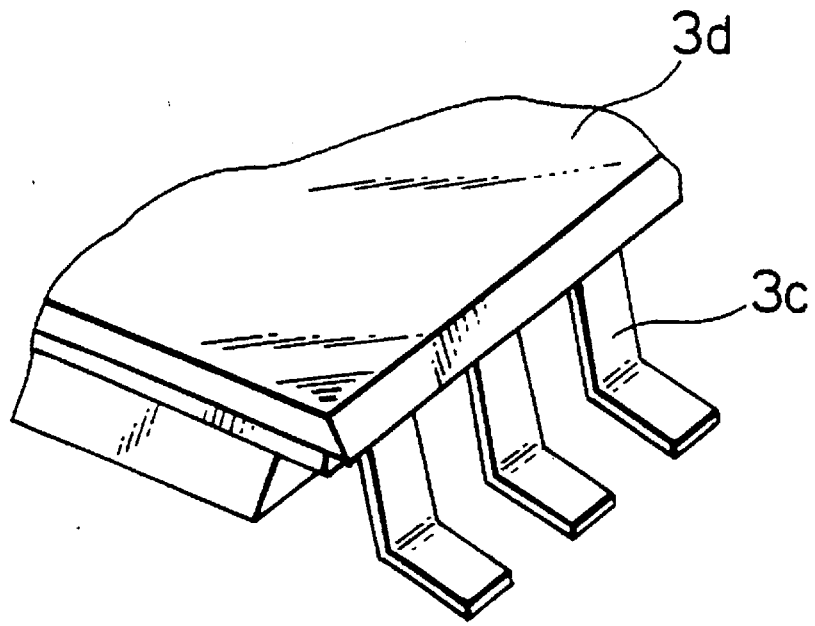
FIGS. 6A and 6B are a fragmentary perspective view and a side view, respectively, of an IC package in accordance with an embodiment of the invention.
Figure 6B:
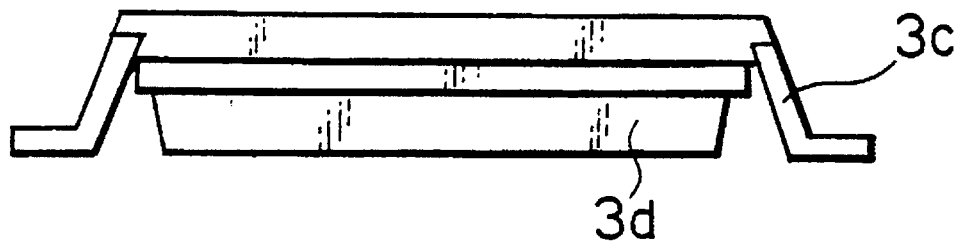

FIGS. 6A and 6B show an IC package 23 in accordance with an embodiment of the present invention. FIG. 6A is a perspective view of a portion of the IC package 23, and FIG. 6B is a side view of the IC package 23. The IC package 23 of this embodiment is constructed particularly as an upper lead type IC package in such a manner that package body 3d is formed so as to extend over i.e., encapsulate or cover shoulder portions of external leads 3c. By using this package body design, it is possible to prevent contact between external leads of IC packages disposed close to or in contact with each other as well as to prevent application of static electricity from the metallic panels to external leads of IC packages mounted on the mount surfaces facing the metallic panels.

Such package body 3d can be easily formed by changing the mold for forming the package body.

The shape of the package body is not limited to that shown in FIG. 6, and any other shapes suitable for covering the shoulder portions of the external leads from above, i.e., on the side remote from the mount surface are possible. Also, the IC package is not limited to the upper lead type, and the shape of the external leads is not limited to the illustrated shape.

(Embodiment 6)

Figure 7A:
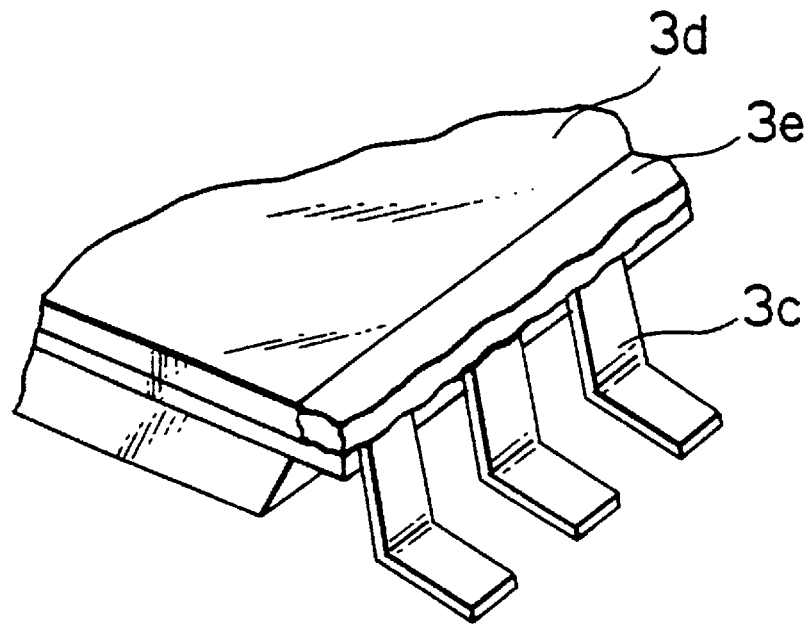
FIGS. 7A and 7B are a fragmentary perspective view and a side view, respectively, of an IC package in accordance with another embodiment of the invention.
Figure 7B:
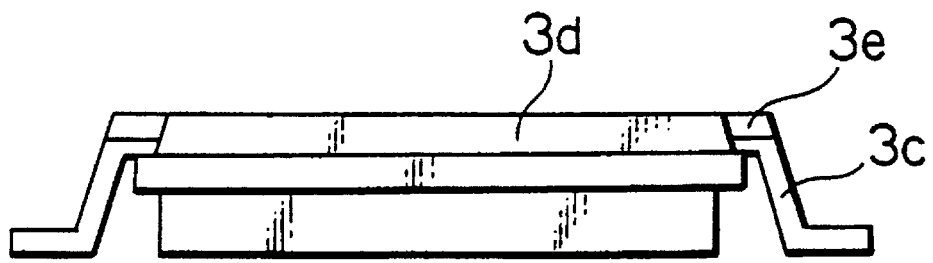

FIGS. 7A and 7B show an IC package 23a in accordance with another embodiment of the present invention. FIG. 7A is a perspective view of a portion of the IC package 23a, and FIG. 7B is a side view of the IC package 23. The IC package 23a of this embodiment is constructed in such a manner that an insulating resin 3e is attached as a protective coating member to upper surfaces of shoulder portions of external leads 3c after the formation of the ordinary IC package body. This IC package 23a can also be used to achieve the same effect as that of Embodiment 5.

Insulating resin 3e is formed on the shoulder portions of external leads 3c, for example, by using a mask to form insulating resin 3e only at necessary positions on the IC package, using a mold to form the insulating resin only at necessary positions on the IC package, or simply by applying the insulating resin and thereafter removing unnecessary portions of the insulating resin.

The kinds of IC packages, the shape of the external leads and the shape and the extent of the insulating resin 3e are not limited to those illustrated in FIGS. 7A and 7B. Any arrangement will suffice as long as insulating resin 3e is formed so as to cover at least the highest portions (e.g., shoulder portions) of the external leads from above, i.e., from the side remote from the mount surface.

(Embodiment 7)

Figure 8:
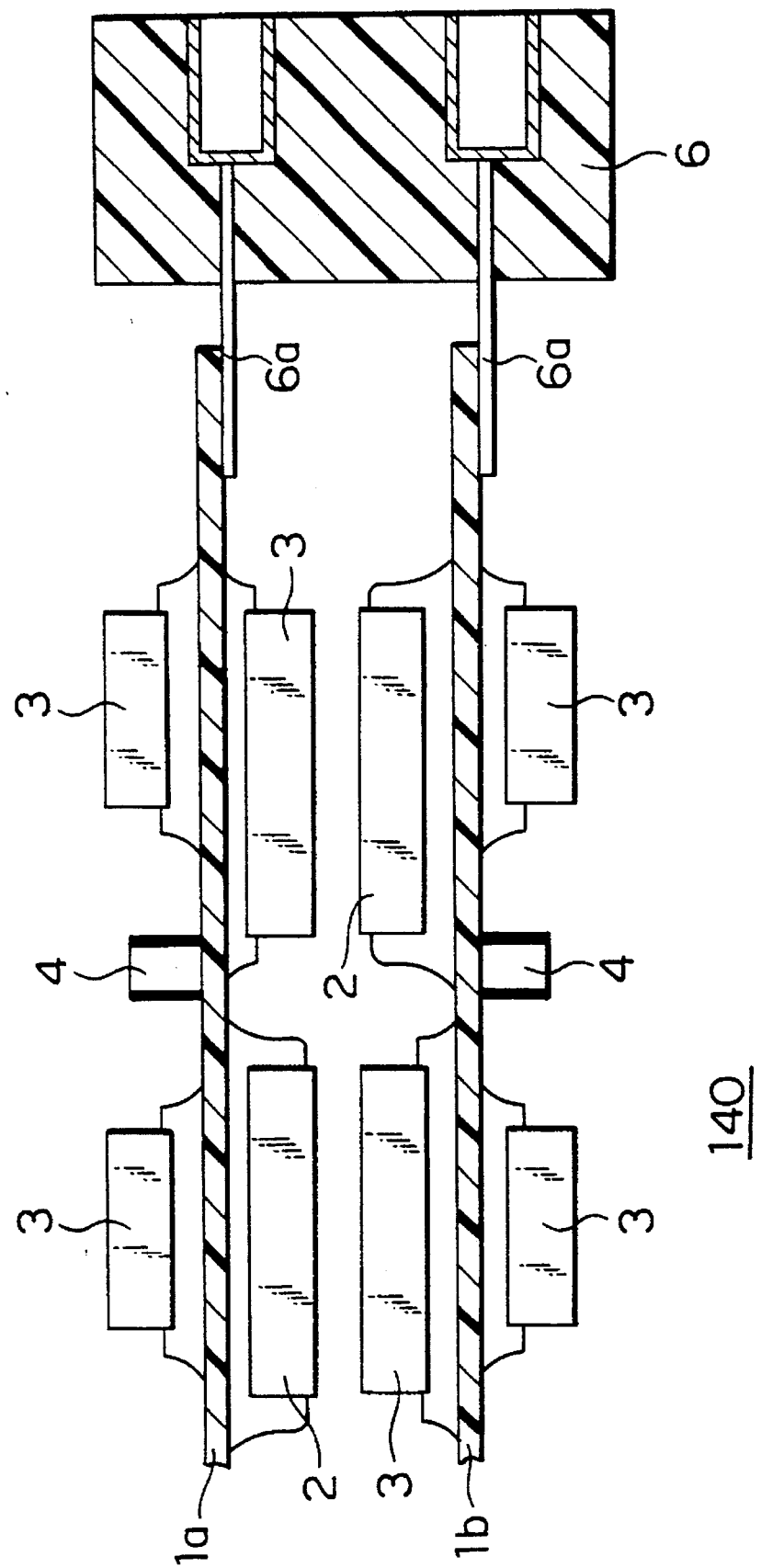
FIG. 8 is cross-sectional view of a portion of a semiconductor module in accordance with an embodiment of the invention.

FIG. 8 is a cross-sectional view of a portion of a semiconductor module (IC card) 140 in accordance with an embodiment of the present invention. Components 1 to 5 of the semiconductor module 140 shown in FIG. 8 are identical to those indicated by the same reference characters in FIG. 1. In this embodiment, however, the manner of superposing the circuit boards 1a, 1b, the structure of each of IC packages 2, 3 and chip parts 4 mounted on the circuit boards 1a, 1b, and the method of mounting these components are not particularly limited. The invention in this aspect is characterized in the structure of connector 6 for electrical connection to an external unit. In the IC card illustrated in FIG. 11 as a conventional semiconductor module, a circuit board unit formed by connecting a plurality of circuit boards is used and only one of the circuit boards in the circuit unit is connected to a connector. Therefore, as described above, the length of a pattern wiring between the connector and a circuit portion remote from the connector is large and the line impedance is correspondingly high. Accordingly, a signal potential on such a line is considerably reduced at the connector and it is difficult to reliably obtain a signal at the connector having a normal potential.

In the semiconductor module 140 of this embodiment, the connector 6 is provided with connector leads 6a, which respectively connect the circuit boards 1a, 1b to the connector 6. In this manner, the problem of the possibility of failure to transmit a signal at a normal level due to a large length of the pattern wiring is solved.

(Embodiment 8)

Figure 9:
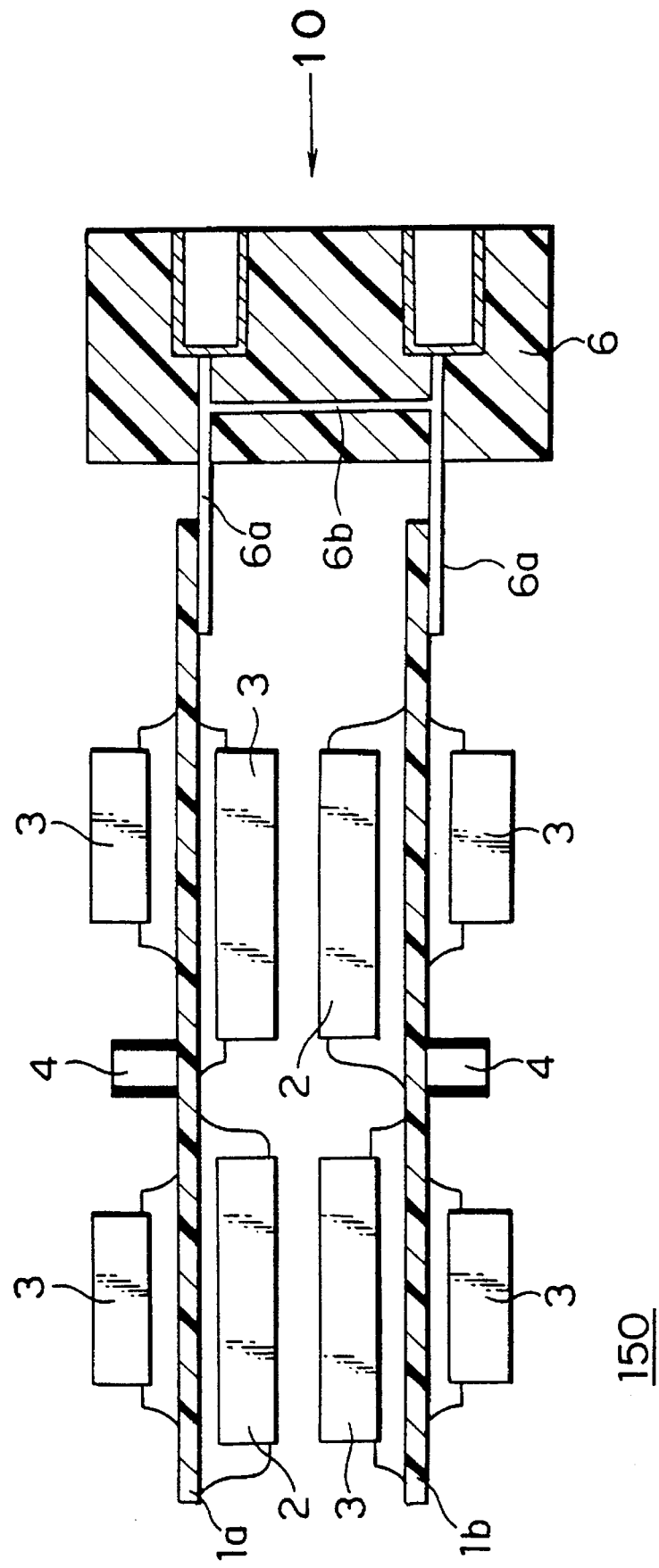
FIG. 9 is cross-sectional view of a portion of a semiconductor module in accordance with an embodiment of the invention.
Figure 10:
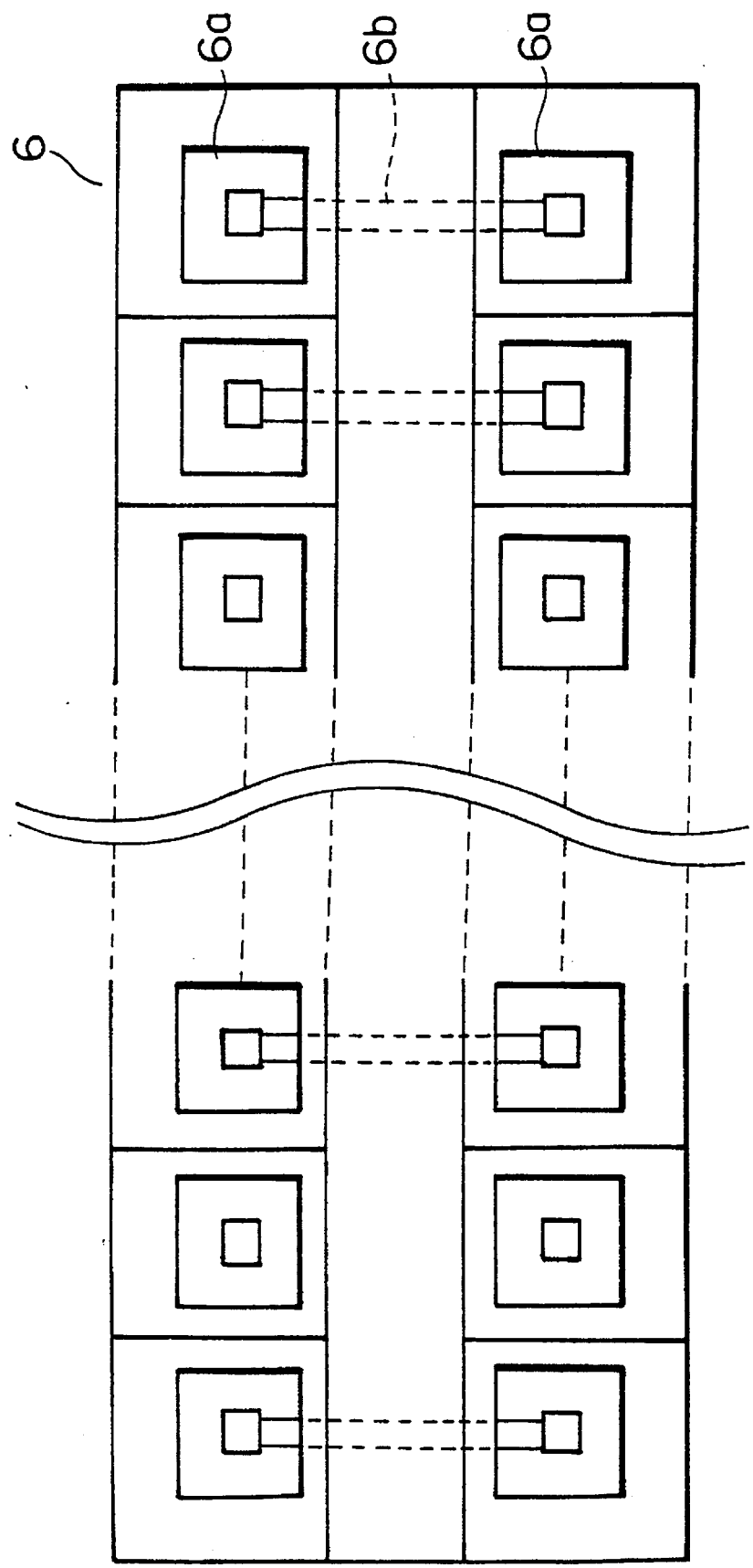
FIG. 10 is a side view of the connector seen in the direction of arrow 10 in FIG. 9.

FIG. 9 is a cross-sectional view of a portion of a semiconductor module (IC card) 150 in accordance with an embodiment of the present invention. FIG. 10 is a perspective view of a connector 6 seen in the direction of arrow A in the semiconductor module shown in FIG. 10. The connector 6 of the semiconductor module 150 is constructed in such a manner that an internal connection lead 6b is according to the connector 6 for the semiconductor module 140 shown in FIG. 8 to connect, in the connector 6, connector leads 6a for supplying a signal in common to the circuit boards 1a, 1b. The impedance with respect to such a common signal is thereby reduced. Further, a wiring connection conventionally made in an external unit (not shown) may be made inside the connector 6 to enable the corresponding pattern wiring in the external unit to be simplified. Also, there is no need to make electrical connections between the circuit boards in the semiconductor module 150.

Figure 11:
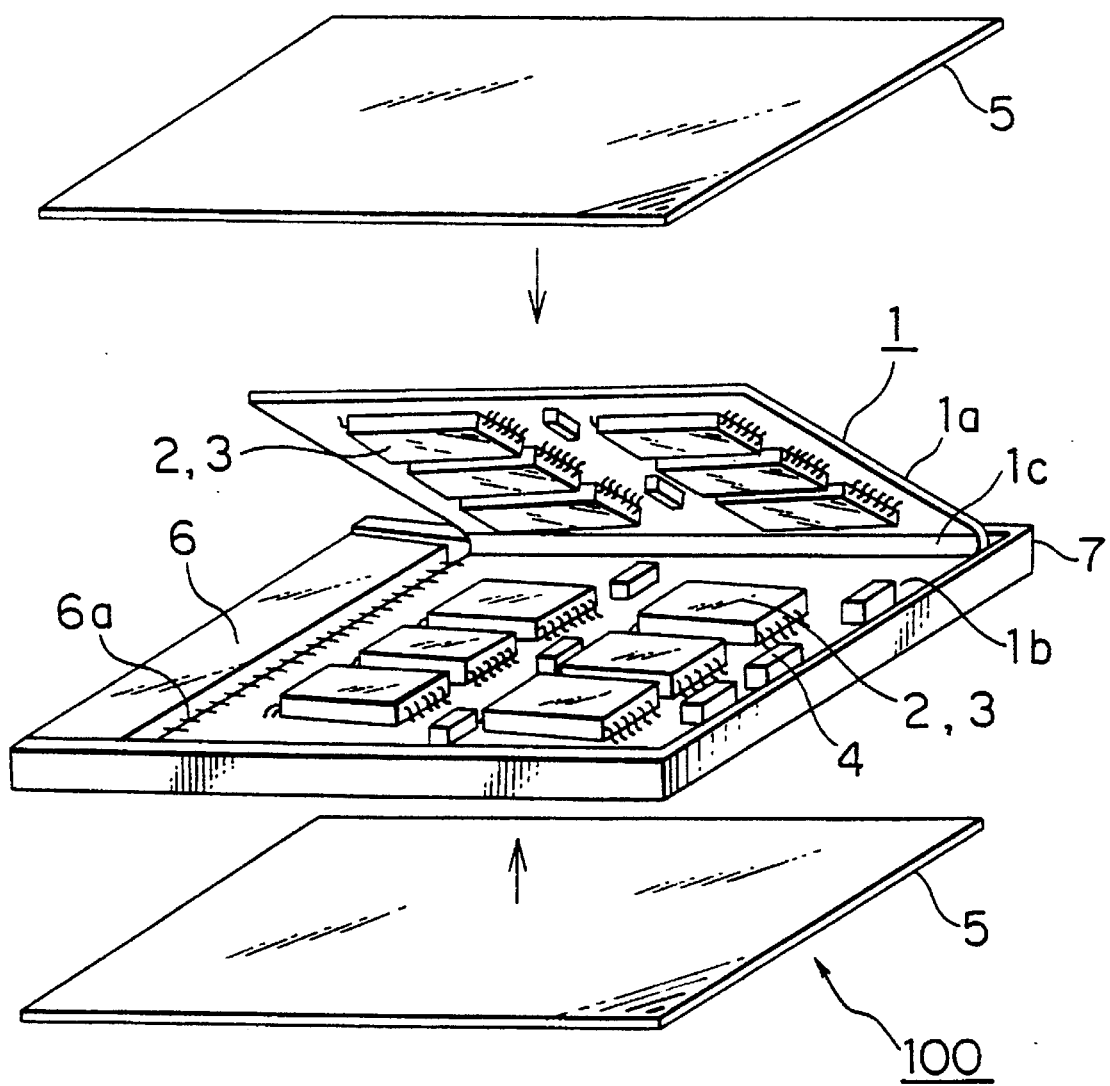
FIG. 11 is an exploded perspective view of an IC card shown as an example of a conventional semiconductor module.

The embodiments of the present invention have been described as semiconductor modules having two circuit boards for ease of understanding of the features of the invention. However, the arrangements of the above-described embodiments are also possible and the same effects can also be achieved even if the semiconductor modules have three or more circuit boards superposed. Further, the circuit boards may be formed independently of each other or may be formed as one continuous member having a plurality of circuit board portions and folded in a zigzag manner, as shown in FIG. 11.

In a semiconductor module according to the present invention, as described above, IC packages are mounted in such a manner that one of two IC packages mounted between an adjacent pair of circuit boards in a back-to-back relationship is an upper lead type IC package while the other is a lower lead type IC package, and a predetermined distance is maintained between leads of the IC packages in contact with each other. By adopting this arrangement, it is possible to provide a low-priced reliable semiconductor module in which contact between leads can be prevented without increasing the distance between circuit boards and without adding any special member, and in which IC packages can be mounted at a high density.

In a semiconductor module according to the present invention, IC packages mounted between an adjacent pair of circuit boards in a back-to-back relationship are shifted from each other so that leads of one of two IC packages in contact with each other are directly opposite the package body of the other IC package, whereby contact between the leads is prevented. By adopting this arrangement, it is possible to provide a low-priced reliable semiconductor module in which contact between leads can be prevented without increasing the distance between circuit boards and without adding any special member, and in which IC packages can be mounted at a high density.

In a semiconductor module according to the present invention, IC packages and chip parts higher in elevation than the leads of the IC packages are mounted on the mount surfaces of the outermost circuit boards facing metallic panels, that is, the height of the leads of the IC packages mounted on each outermost mount surface is reduced relative to the height of the chip parts mounted on the same mount surface so that the distance between the metallic panel and the leads of the IC packages is larger than the distance between the metallic panel and the chip parts. An ESD from the metallic panel is therefore applied to ground GND of the circuit boards through capacitors provided as chip parts. Therefore there is substantially no risk of ESD being applied to the leads of the IC packages to damage chips in the IC packages by static electricity, and the influence of ESD upon the operation of the IC packages is small. Thus, it is possible to provide a reliable semiconductor module having high resistance to ESD without increasing the distance between the circuit boards and without adding any special member.

In a semiconductor module according to the present invention, conductive dummy component parts higher in elevation than the leads of IC packages and used as conductors are mounted on the mount surfaces of the outermost circuit boards facing metallic panels, so that the distance between each metallic panel and the leads of the IC packages is larger than the distance between the metallic panel and the dummy component parts. An ESD from the metallic panel is therefore applied to ground GND of the circuit boards through the dummy component parts. Therefore there is substantially no risk of an ESD being applied to the leads of the IC packages to damage chips in the IC packages by static electricity, and the influence of an ESD upon the operation of the IC packages is small. Thus, it is possible to provide a reliable semiconductor module having high resistance to an ESD without increasing the distance between the circuit boards.

In an IC package according to the fifth aspect of the present invention, insulating members are provided on upper surfaces of shoulder portions of external leads of the IC packages to prevent contact between the external leads of the IC packages mounted close to or in contact with each other in a back-to-back relationship as well as to prevent application of static electricity from metallic panels to the external leads of the IC packages mounted on the mount surfaces facing the metallic panels. Therefore, in a case where IC packages are mounted in a high density to form a semiconductor module, it is possible to provide an IC module having improved reliability.

In the semiconductor module according to the sixth aspect of the present invention, a connector is provided with connector leads to make electrical connections between each of a plurality of circuit boards and the connector in order to limit the length of pattern wiring from the connector to each circuit board. A drop of the signal level depending upon the line impedance is thereby prevented. It is therefore possible to provide a semiconductor module having further improved reliability.

In a semiconductor module according to the present invention, an internal connection lead is provided to connect connector leads for supplying a signal in common to different circuit boards, thereby enabling the corresponding pattern wiring in an external unit to be simplified and eliminating the need for electrical connection between the circuit boards. Thus, it is possible to provide a semiconductor module simplifying the related structures.

What is claimed is:

1. A semiconductor module comprising:

a plurality of circuit boards superposed one on another, each circuit board having two opposed surfaces; and groups of electronic parts mounted on the two opposed surfaces of each of said circuit boards, said groups of electronic parts including IC packages, each IC package having a package body and leads extending outward from at least one side surface of the package body, wherein said IC packages mounted between an adjacent pair of said circuit boards in a back-to-back relationship are located on said circuit boards so that with respect to two of said IC packages close to or in contact the leads of one of the IC packages on one of said circuit boards are directly opposite the package body of an IC package on the other of said circuit boards.

* * * * *

UNITED STATES PATENT AND TRADEMARK OFFICE
CERTIFICATE OF CORRECTION

PATENT NO. : 5,583,748
DATED : December 10, 1996
INVENTOR(S) : Gochi et al.

It is certified that error appears in the above-indentified patent and that said Letters Patent is hereby corrected as shown below:

Column 12, Line 12, delete --with respect to--;

Line 13, delete --two of said IC packages close to or in contact--.

Signed and Sealed this

First Day of April, 1997

Attest:

BRUCE LEHMAN

Attesting Officer

Commissioner of Patents and Trademarks